United States Patent
No et al.

(10) Patent No.: US 10,005,933 B2
(45) Date of Patent: Jun. 26, 2018

(54) DISPLAY DEVICE

(71) Applicant: Samsung Display Co., Ltd., Yongin-si, Gyeonggi-do (KR)

(72) Inventors: Donghun No, Cheongju-si (KR); Jonghwan Kim, Busan (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 302 days.

(21) Appl. No.: 14/831,524

(22) Filed: Aug. 20, 2015

(65) Prior Publication Data

US 2016/0152875 A1 Jun. 2, 2016

(30) Foreign Application Priority Data

Dec. 2, 2014 (KR) ........................ 10-2014-0170239

(51) Int. Cl.
| | |
|---|---|
| *C08F 2/46* | (2006.01) |
| *C08G 61/04* | (2006.01) |
| *C09J 133/08* | (2006.01) |
| *H01L 27/32* | (2006.01) |
| *H01L 51/52* | (2006.01) |
| *C09J 133/06* | (2006.01) |
| *G02F 1/1333* | (2006.01) |

(52) U.S. Cl.
CPC ........... *C09J 133/08* (2013.01); *C09J 133/06* (2013.01); *H01L 27/3244* (2013.01); *H01L 51/524* (2013.01); *H01L 51/5246* (2013.01); *G02F 2001/133331* (2013.01); *G02F 2202/28* (2013.01); *H01L 51/5281* (2013.01); *H01L 51/5284* (2013.01)

(58) Field of Classification Search
CPC .............. C09J 133/08; G02F 1/133528; G02F 1/133308; G02F 2001/133331; G02F 2002/28; H01L 27/3244; H01L 51/5281; H01L 51/8546; H01L 51/8284; H01L 51/524

USPC ................. 522/153, 150, 1, 161, 157; 520/1
See application file for complete search history.

(56) References Cited

U.S. PATENT DOCUMENTS

| | | | | |
|---|---|---|---|---|
| 2009/0284698 | A1* | 11/2009 | Kim | ...................... C09D 11/10 349/106 |
| 2014/0017451 | A1* | 1/2014 | Hwang | ................... C09J 133/08 428/172 |
| 2014/0142210 | A1 | 5/2014 | Zhang et al. | |
| 2014/0329927 | A1 | 11/2014 | Ha et al. | |
| 2015/0010766 | A1* | 1/2015 | Hwang | ................. B32B 37/223 428/523 |
| 2016/0102229 | A1* | 4/2016 | Takarada | ............... C09J 133/08 156/250 |

FOREIGN PATENT DOCUMENTS

| | | |
|---|---|---|
| KR | 10-2006-0109148 A | 10/2006 |
| KR | 10-2013-0063939 A | 6/2013 |
| KR | 10-2013-0120474 A | 11/2013 |
| KR | 10-2014-0058513 A | 5/2014 |

* cited by examiner

*Primary Examiner* — Jessica Whiteley
(74) *Attorney, Agent, or Firm* — Knobbe Martens Olson & Bear LLP

(57) ABSTRACT

Disclosed is a display device that includes: a display panel; a window on a surface of the display panel; and an adhesive layer between the display panel and the window. The adhesive layer may include an adhesive composition, the adhesive composition containing: a first polymer having a glass transition temperature (Tg) in a range of about 95° C. to about 120° C.; a second polymer having a glass transition temperature (Tg) in a range of about 60° C. to about 90° C.; a third polymer having a glass transition temperature (Tg) in a range of about −35° C. to about −25° C.; and a fourth polymer having a glass transition temperature (Tg) in a range of about −60° C. to about −45° C.

11 Claims, 3 Drawing Sheets

DISPLAY DEVICE

RELATED APPLICATION

Any and all priority claims identified in the Application Data Sheet, or any correction thereto, are hereby incorporated by reference under 37 CFR 1.57. For example, this application claims priority to and the benefit of Korean Patent Application No. 10-2014-0170239, filed on Dec. 2, 2014 with the Korean Intellectual Property Office, the disclosure of which is incorporated herein in its entirety by reference.

BACKGROUND

Field

The disclosure relates to a display device including an adhesive layer composed of an adhesive composition having a high hardness.

Description of the Related Technology

Display devices may be classified into two types: a self-emission type that may emit light on its own, such as a cathode ray tube (CRT), an electro luminescence (EL), a vacuum fluorescent display (VFD), a field emission display (FED), and a plasma display panel (PDP); and a non-emission type that may not emit light on its own, such as a liquid crystal display (LCD).

Display devices with low power consumption, light weight, a thin film structure, high definition, high transparency, and the like are desirable.

Display devices include a display panel for displaying images, a window for protecting the display panel from external shocks or scratches, and an optically clear adhesive (OCA) film for adhesively bonding the display panel and the window to each other.

When impacts or shocks are externally imposed on the display device, the window may tilt over. In this case, an upper substrate of the display panel may also tilt in the tilting direction of the window, such that the upper substrate may be partially detached from a lower substrate. Accordingly, a crack may appear on a sealing unit disposed between the upper and lower substrates.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Some embodiments provide a display device capable of preventing detachment of an upper substrate from a lower substrate, thereby preventing crack formation on a sealing unit.

Some embodiments provide an adhesive composition having a high hardness.

Some embodiments provide a display device including an adhesive layer composed of an adhesive composition having a high hardness.

Some embodiments provide an adhesive composition including: an oligomer in an amount of about 30 percentage by weight (wt %) to about 70 wt %; at least four kinds of monomers in an amount of about 25 wt % to about 65 wt %; and a photopolymerization initiator in an amount of about 1 wt % to about 5 wt %. In some embodiments, the monomer includes: a first monomer having a glass transition temperature (Tg), in a polymerization process, in a range of about 95° C. to about 120° C.; a second monomer having a glass transition temperature (Tg) in a range of about 60° C. to about 90° C.; a third monomer having a glass transition temperature (Tg) in a range of about −35° C. to about −25° C.; and a fourth monomer having a glass transition temperature (Tg) in a range of about −60° C. to about −45° C.

In some embodiments, the adhesive composition may have a viscosity in a range of about 2,000 millipascal-second (mPa·s) to about 150,000 mPa·s.

In some embodiments, the oligomer may have a molecular weight in a range of about 5,000 grams per mole (g/mol) to about 20,000 g/mol.

In some embodiments, the first monomer may be at least one of dicyclopentanylacrylate, methylmethacrylate, and isobonylacrylate.

In some embodiments, the second monomer may be at least one of 2-ethylhexylacrylate and ethylmethacrylate.

In some embodiments, the third monomer may be at least one of 4-hydroxybutylacrylate and laurylacrylate.

In some embodiments, the fourth monomer may be at least one of isooctylacrylate, propylacrylate, and n-butylacrylate.

In some embodiments, the adhesive composition may include: the first monomer in an amount of about 35 wt % to about 65 wt %; the second monomer in an amount of about 15 wt % to about 25 wt %; the third monomer in an amount of about 15 wt % to about 25 wt %; and the fourth monomer in an amount of about 5 wt % to about 15 wt %, with respect to 100 wt % of the monomer.

Some embodiments provide a display device including: a display panel; a window on a surface of the display panel; and an adhesive layer between the display panel and the window. In some embodiments, the adhesive layer includes: an adhesive composition, the adhesive composition containing: a first polymer having a glass transition temperature (Tg) in a range of about 95° C. to about 120° C.; a second polymer having a glass transition temperature (Tg) in a range of about 60° C. to about 90° C.; a third polymer having a glass transition temperature (Tg) in a range of about −35° C. to about −25° C.; and a fourth polymer having a glass transition temperature (Tg) in a range of about −60° C. to about −45° C.

In some embodiments, the adhesive layer may have a shore A hardness of more than or equal to about 10.

In some embodiments, the first polymer may be at least one of poly-dicyclopentanylacrylate, poly-methylmethacrylate, and poly-isobonylacrylate.

In some embodiments, the second polymer may be at least one of poly-2-ethylhexylacrylate and poly-ethylmethacrylate.

In some embodiments, the third polymer may be at least one of poly-4-hydroxybutylacrylate and poly-laurylacrylate.

In some embodiments, the fourth polymer may be at least one of poly-isooctylacrylate, poly-propylacrylate, and poly-n-butylacrylate.

In some embodiments, the display panel may include: a first substrate; a second substrate stacked on the first substrate; and a polarizing layer stacked on the second substrate, the polarizing layer facing the window.

In some embodiments, the adhesive layer may be disposed between the polarizing layer and the window.

In some embodiments, the display device may further include a black film attached on a rear surface of the display panel.

In some embodiments, the display panel may be an organic light emitting display panel.

In some embodiments, the display panel may be a liquid crystal display panel.

Some embodiments provide an adhesive layer having a high hardness may adhesively bond a window and a display panel to each other, thereby preventing a first substrate of a display panel from being partially detached from a second substrate. Accordingly, crack formation on a sealing unit between the first substrate and the second substrate may be prevented.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
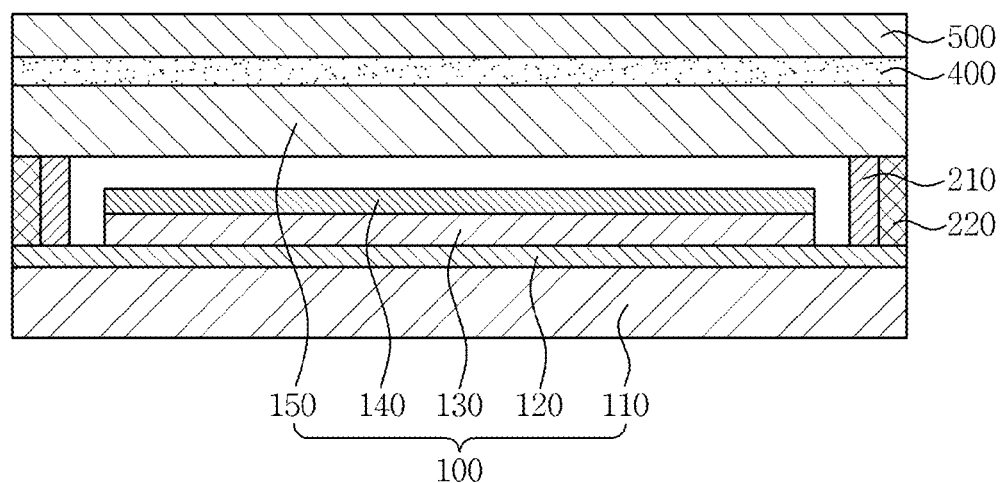
FIG. 1 is a cross-sectional view illustrating a display device according to an exemplary embodiment.

Advantages and features of the present disclosure and methods for achieving them will be made clear from specific embodiments described below in detail with reference to the accompanying drawings. The present embodiments may, however, be embodied in many different forms and should not be construed as being limited to the specific embodiments set forth herein. Rather, these specific embodiments are provided so that this disclosure will be thorough and complete, and will fully convey the scope of the embodiments to those skilled in the art. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

The terminology used herein is for the purpose of describing particular example embodiments only and is not intended to be limiting. Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some embodiments provide an adhesive composition including: an oligomer in an amount of about 30 wt % to about 70 wt %; at least four kinds of monomers in an amount of about 25 wt % to about 65 wt %; and a photopolymerization initiator in an amount of about 1 wt % to about 5 wt %. In some embodiments, the monomer may include: a first monomer having a glass transition temperature (Tg), in a polymerization process, in a range of about 95° C. to about 120° C.; a second monomer having a glass transition temperature (Tg) in a range of about 60° C. to about 90° C.; a third monomer having a glass transition temperature (Tg) in a range of about −35° C. to about −25° C.; and a fourth monomer having a glass transition temperature (Tg) in a range of about −60° C. to about −45° C.

Some embodiments provide a display device including: a display panel; a window on a surface of the display panel; and an adhesive layer between the display panel and the window. The adhesive layer may include: a first polymer having a glass transition temperature (Tg), in a photopolymerization process, in a range of about 95° C. to about 120° C.; a second polymer having a glass transition temperature (Tg) in a range of about 60° C. to about 90° C.; a third polymer having a glass transition temperature (Tg) in a range of about −35° C. to about −25° C.; and a fourth polymer having a glass transition temperature (Tg) in a range of about −60° C. to about −45° C.

Hereinafter, an exemplary embodiment will be described with reference to FIG. 1.

A display device of FIG. 1 includes a display panel 100, a window 500, and an adhesive layer 400 interposed between the display panel 100 and the window 500.

In some embodiments, the display panel 100 is configured to display images, and may be a liquid crystal display (LCD) panel, an electrophoretic display (EPD) panel, an organic light emitting diode (OLED) panel, a light emitting diode (LED) panel, an inorganic electroluminescence (EL) panel, a field emission display (FED) panel, a surface-conduction electron-emitter display (SED) panel, a plasma display panel (PDP), a cathode ray tube (CRT) panel, or the like.

Hereinafter, an OLED display device will be described as an example of the display device according to an exemplary embodiment, and an OLED panel as the display panel 100.

However, the display device and the display panel according to the present invention are not limited thereto, and thus various types of display devices and display panels may be also applicable.

Hereinafter, the OLED display panel 100 will be described with reference to FIGS. 2 and 3.

Figure 2:
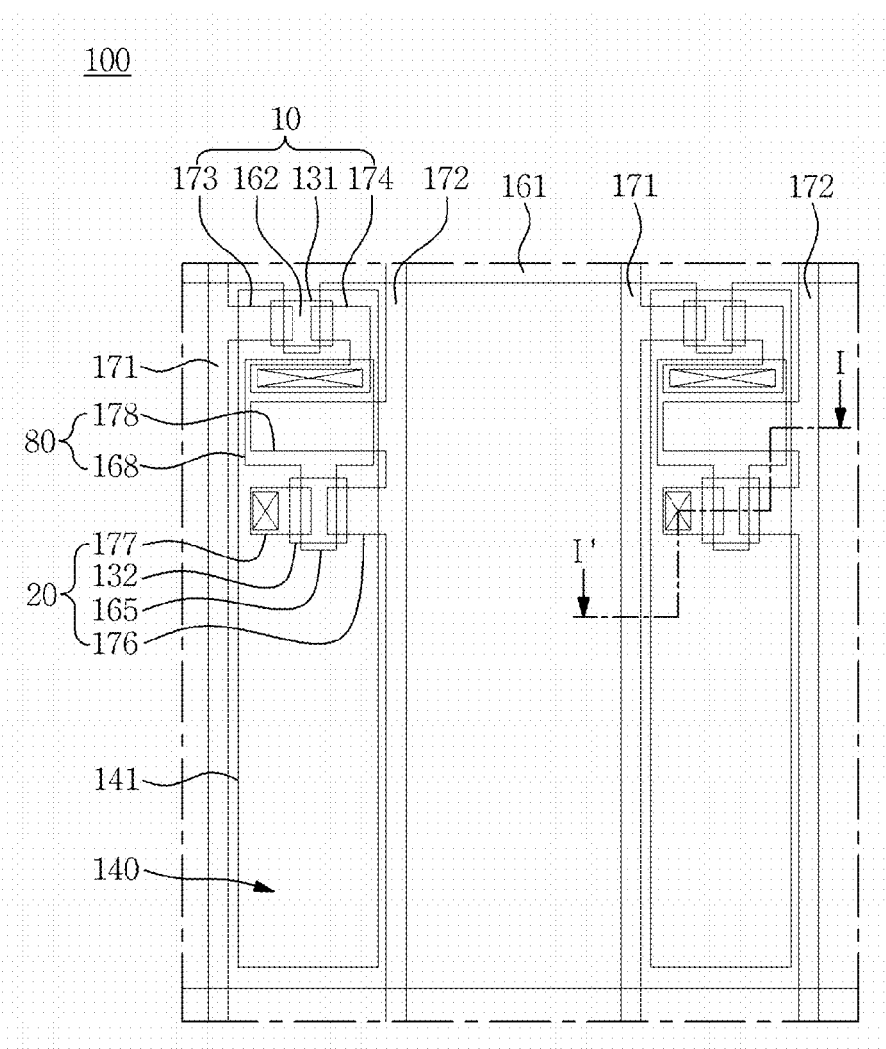
FIG. 2 is an enlarged plan view illustrating an interior structure of the display device of FIG. 1.

FIG. 2 is an enlarged plan view illustrating an interior structure of the OLED display panel 100 of FIG. 1. FIG. 3 is a cross-sectional view taken along line I-I' of FIG. 2.

Figure 3:
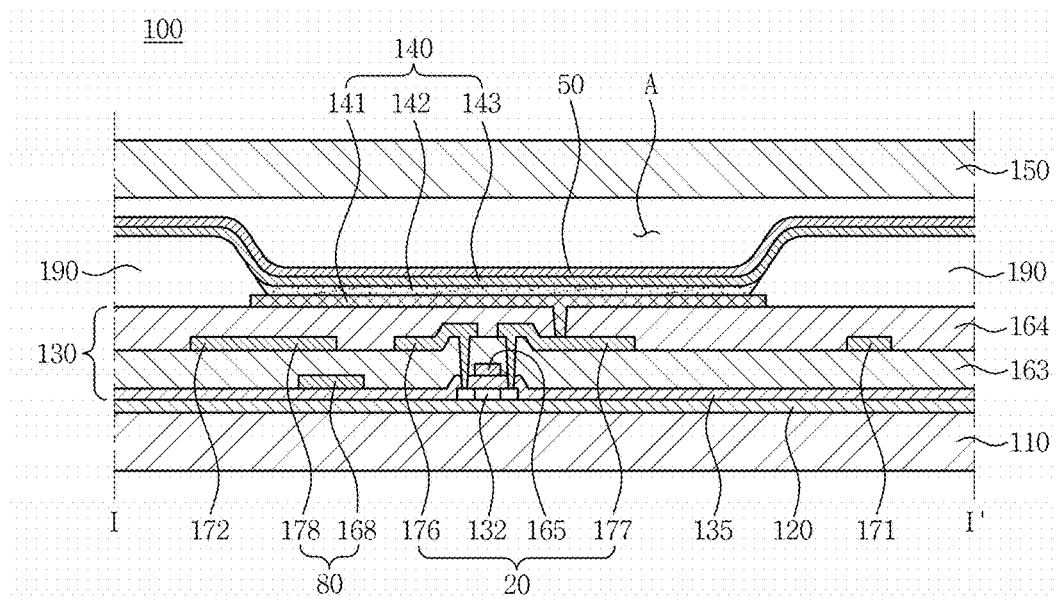
FIG. 3 is a cross-sectional view taken along line I-I' of FIG. 2.

The OLED display panel 100 illustrated in FIGS. 2 and 3 includes a first substrate 110, a driver circuit unit 130, an OLED 140 serving as a display element, and a second substrate 150. In some embodiments, the OLED display panel 100 may further include a barrier layer 120 and a pixel defining layer 190.

In some embodiments, the first substrate 110 may include glass, transparent flexible materials, or opaque insulating materials. The transparent flexible materials may include, for example, polyimide, polyetherimide (PEI), and polyethyleneterephthalate (PET). In embodiments of a bottom-emission type in which an image is displayed toward the first substrate 110, the first substrate 110 may be transparent. In embodiments of a top-emission type, the first substrate 110 may not be transparent and may include various materials.

In some embodiments, the barrier layer 120 is disposed on the first substrate 110. In some embodiments, the barrier layer 120 is disposed directly on the first substrate 110. In some embodiments, the barrier layer 120 may include at least one layer of various inorganic layers and organic layers. In some embodiments, the barrier layer 120 is configured to prevent infiltration of undesired components, such as impurities or moisture, into the driver circuit unit 130 or the OLED 140 and to planarize the surface thereof. However, the barrier layer 120 is not always necessary, and may be omitted where necessary.

In some embodiments, the driver circuit unit 130 is disposed on the first substrate 110. In some embodiments, the driver circuit unit 130 is disposed directly on the first substrate 110. In some embodiments, the driver circuit unit 130 may include thin film transistors (TFTs) 10 and 20 (refer to FIG. 2), and may operate the OLED 140 serving as a display element according to an exemplary embodiment. In some embodiments, the OLED 140 may emit light according to a driving signal applied from the driver circuit unit 130 to display images.

FIGS. 2 and 3 illustrate a detailed configuration of the driver circuit unit 130 and the OLED 140; however, additional embodiments are not limited to the configurations illustrated in FIGS. 2 and 3. The configurations of the driver circuit unit 130 and the OLED 140 are susceptible to various modifications and alternatives that are understood by those skilled in the art.

FIGS. 2 and 3 illustrate an active matrix-type organic light emitting diode (AMOLED) display panel 100 having a 2Tr-1Cap structure. In some embodiments, the 2Tr-1Cap structure may include two TFTs 10 and 20 and a capacitor 80 in each pixel, but additional embodiments are not limited thereto. In some embodiments, the display device may include three or more TFTs and two or more capacitors 80 in one pixel, and may further include separate conductive wirings. Herein, the term "pixel" refers to the smallest unit for displaying an image, and the pixel may be disposed in each pixel region. In some embodiments, the OLED display panel 100 may display an image using a plurality of pixels.

In some embodiments, each pixel may include the switching TFT 10, the driving TFT 20, the capacitor 80, and the OLED 140. Further, a structure including the switch TFT 10, the driving TFT 20, and the capacitor 80 is called the driver circuit unit 130. In some embodiments, the driver circuit unit 130 may further include a gate line 161 disposed along one direction, a data line 171 insulated from and intersecting the gate line 161, a common power line 172. In some embodiments, each pixel may be defined by the gate line 161, the data line 171, and the common power line 172, but is not limited thereto. In some embodiments, pixels may be defined by a black matrix and/or a pixel defining layer (PDL).

In some embodiments, the OLED 140 includes a first electrode 141, an organic light emitting layer 142 on the first electrode 141, and a second electrode 143 on the organic light emitting layer 142. In some embodiments, a hole and an electron are respectively supplied from the first electrode 141 and the second electrode 143 into the organic light emitting layer 142, and then combined with each other therein to form an exciton. In some embodiments, the OLED 140 may emit light by energy generated when the exciton falls from an excited state to a ground state.

In some embodiments, the capacitor 80 includes a pair of capacitor plates 168 and 178 with an interlayer insulating layer 163 interposed therebetween. In some embodiments, the interlayer insulating layer 163 may be a dielectric. In some embodiments, capacitance of the capacitor 80 may be determined by electric charges accumulated in the capacitor 80 and voltage across the pair of capacitor plates 168 and 178.

In some embodiments, the switching TFT 10 includes a switching semiconductor layer 131, a switching gate electrode 162, a switching source electrode 173, and a switching drain electrode 174. In some embodiments, the driving TFT 20 includes a driving semiconductor layer 132, a driving gate electrode 165, a driving source electrode 176, and a driving drain electrode 177. In some embodiments, a gate insulating layer 135 may be further provided to insulate the semiconductor layers 131 and 132 and the gate electrodes 162 and 155.

In some embodiments, the switching TFT 10 may function as a switching element which selects a pixel to perform light emission. In some embodiments, the switching gate electrode 162 may be connected to the gate line 161, and the switching source electrode 173 may be connected to the data line 171. In some embodiments, the switching drain electrode 174 may be spaced apart from the switching source electrode 173 and connected to one of the capacitor plates 168.

In some embodiments, the driving TFT 20 may apply a driving power, which allows the organic light emitting layer 142 of the OLED 140 in a selected pixel to emit light, to the first electrode 141 serving as a pixel electrode. In some embodiments, the driving gate electrode 165 may be connected to the capacitor plate 168 that is connected to the switching drain electrode 174. In some embodiments, the driving source electrode 176 and the other capacitor plate 178 may be respectively connected to the common power line 172. In some embodiments, the planarizing layer 164 may be disposed on the TFTs 10 and 20, and the driving drain electrode 177 may be connected to the first electrode 141 of the OLED 140 through a contact hole formed on the planarizing layer 164.

In some embodiments, the switching TFT 10 may be operated by a gate voltage applied to the gate line 161 and may transmit a data voltage applied to the data line 171 to the driving TFT 20 with the aforementioned structure. In some embodiments, a voltage equivalent to a difference between a common voltage applied from the common power line 172 to the driving TFT 20 and the data voltage transmitted from the switching TFT 10 may be stored in the capacitor 80, and a current corresponding to the voltage stored in the capacitor 80 may flow to the OLED 140 via the driving TFT 20, so that the OLED 140 may emit light.

In some embodiments, the first electrode 141 may serve as an anode to inject holes and the second electrode 143 may serve as a cathode to inject electrons. In some embodiments, the first electrode 141 may serve as a cathode and the second electrode 143 may serve as an anode.

In some embodiments, the planarizing layer 164 may be disposed on the interlayer insulating layer 163. In some embodiments, the planarizing layer 164 may include insulating materials and may protect the driver circuit unit 130. In some embodiments, the planarizing layer 164 and the interlayer insulating layer 163 may include the same material.

In some embodiments, the drain electrode 177 of the driving TFT 20 may be connected to the first electrode 141 of the OLED 140 through a contact hole formed on the planarizing layer 164.

In some embodiments, the first electrode 141 may be a reflective electrode and the second electrode 143 may be a transflective electrode. Accordingly, light generated in the organic light emitting layer 142 may pass through the second electrode 143 for light emission. In some embodiments, the OLED display panel 100 may have a top-emission type structure.

In some embodiments, one or more of magnesium (Mg), silver (Ag), gold (Au), calcium (Ca), lithium (Li), chromium (Cr), aluminum (Al), and copper (Cu), or a metal alloy thereof may be used to form the reflective electrode and the transflective electrode. In this regard, whether the electrode is a reflective type or a transflective type depends on the thickness. In general, the transflective layer has a thickness less than or equal to about 200 nm. Transmittance of light may increase in accordance with a decrease in the thickness and transmittance of light may decrease in accordance with an increase in the thickness.

In some embodiments, the first electrode 141 may include a reflective layer including at least one metal of magnesium (Mg), silver (Ag), gold (Au), calcium (Ca), lithium (Li), chromium (Cr), aluminum (Al), and copper (Cu), and a transparent conductive layer disposed on the reflective layer. Herein, the transparent conductive layer may include a transparent conductive oxide (TCO), for example, at least one of indium tin oxide (ITO), indium zinc oxide (IZO), zinc oxide (ZnO), aluminum zinc oxide (AZO), and indium oxide ($In_2O_3$). Such transparent conductive layer may have a relatively high work function, thereby allowing more active hole injection through the first electrode 141.

In some embodiments, the first electrode 141 may have a triple-layer structure including a transparent conductive layer, a reflective layer, and a transparent conductive layer that are sequentially laminated.

In some embodiments, the second electrode 143 may be formed of a transflective layer including one or more metal of magnesium (Mg), silver (Ag), gold (Au), calcium (Ca), lithium (Li), chromium (Cr), aluminum (Al), and copper (Cu).

In some embodiments, at least one of a hole injection layer HIL and a hole transporting layer HTL may be further disposed between the first electrode 141 and the organic light emitting layer 142. In some embodiments, at least one of an electron transporting layer ETL and an electron injection layer EIL may be further disposed between the organic light emitting layer 142 and the second electrode 143.

In some embodiments, a structure including the organic light emitting layer 142, the hole injection layer HIL, the hole transporting layer HTL, the electron transporting layer ETL, and the electron injection layer EIL may also be referred to as an organic layer. In some embodiments, the organic layer may include a low molecular weight organic material or a high molecular weight organic material.

In some embodiments, the low molecular weight organic materials may be applicable to the HIL, the HTL, the organic light emitting layer, the ETL, and/or the EIL. In some embodiments, the low molecular weight organic materials may have a single-layer or a multi-layer laminated structure. In this regard, examples of the applicable suitable organic material may include copper phthalocyanine (CuPc), N,N'-Di(naphthalene-1-yl)-N,N'-diphenyl-benzidine (NPB), tris-8-hydroxyquinoline aluminum ($Alq_3$), and the like.

In some embodiments, the pixel defining layer 190 may have an aperture. In some embodiments, a part of the first electrode 141 may be exposed through the aperture of the pixel defining layer 190. The first electrode 141, the organic light emitting layer 142, and the second electrode 143 may be sequentially laminated in the aperture of the pixel defining layer 190. In some embodiments, the second electrode 143 may be formed not only on the organic light emitting layer 142 but also on the pixel defining layer 190. The OLED 140 may emit light from the organic light emitting layer 142 disposed in the aperture of the pixel defining layer 190. Accordingly, the pixel defining layer 190 may define a light emission area.

As illustrated in FIG. 3, a capping layer 50 may be disposed on the second electrode 143. In some embodiments, the capping layer 50 may basically protect the OLED 140, and may also allow light emitted in the organic light emitting layer 142 to be efficiently directed outwards.

In some embodiments, the second substrate 150 is disposed on the OLED 140, being opposed to the first substrate 110, so as to protect the OLED 140. In some embodiments, the second substrate 150 is disposed directly on the OLED 140, being opposed to the first substrate 110, so as to protect the OLED 140.

In some embodiments, the second substrate 150 may include glass, quartz, ceramic, plastic and the like, and may include the same materials as that of the first substrate 110. In some embodiments, the second substrate 150 may be sealingly attached to the first substrate 110 and may cover the OLED 140. In some embodiments, the second substrate 150 and the OLED 140 may be spaced apart from each other. In some embodiments, the space between the second substrate 150 and the first substrate 110 may be sealed by a sealant. In some embodiments, an air layer A may be formed in the space between the second substrate 150 and the capping layer 50.

Referring to FIG. 1, the OLED display device according to an exemplary embodiment may further include a first sealant 210 and a second sealant 220.

In some embodiments, the first sealant 210 may be formed between the first substrate 110 and the second substrate 150 and may seal the OLED 140. In some embodiments, the first sealant 210 may be disposed along an edge portion of a display area of the first substrate 110 on which the OLED 140 is provided and an edge portion of the second substrate 150 and may sealingly attach the first substrate 110 and the second substrate 150 to each other. In some embodiments, the first sealant 210 may be positioned inwardly relative to a lateral surface of the first substrate 110 and a lateral surface of the second substrate 150.

In some embodiments, the first sealant 210 may include one of epoxy, acrylate, urethane acrylate, and cyanoacrylate. In some embodiments, the first sealant 210 may be coated on the first substrate 110 in a liquid state and may be subject to ultraviolet (UV) curing, thermal curing, and/or curing at room temperature. For example, when including epoxy, acrylate, and urethane acrylate, the first sealant 210 may be subject to the UV curing; when including acrylate, the first sealant 210 may be subject to the thermal curing at a temperature less than about 80° C.; and when including cyanoacrylate, the first sealant 210 may be subject to the curing at room temperature.

In some embodiments, the second sealant 220 is configured to seal the first sealant 210, and is in contact with an externally exposed surface of the first sealant 210 as illustrated in FIG. 1. In some embodiments second sealant 220 may include one of epoxy, acrylate, urethane acrylate, and cyanoacrylate as in the first sealant 210; however, the present invention is not limited thereto. In some embodiments, the second sealant 220 may include various materials that are capable of preventing infiltration of moisture. When the first sealant 210 is disposed inwardly relative to the lateral surface of the first substrate 110 and the lateral surface of the second substrate 150, the second sealant 220 may be formed between the first substrate 110 and the second substrate 150 to seal the first sealant 210.

In some embodiments, the window 500 may be disposed on the display panel 100 including the first substrate 110, the driver circuit unit 130, the OLED 140, and the second substrate 150. In some embodiments, the window 500 may be disposed directly on the display panel 100 including the first substrate 110, the driver circuit unit 130, the OLED 140, and the second substrate 150. In some embodiments, the window 500 is disposed on the second substrate 150 serving as a display surface of the display panel 100 to protect the display panel. In some embodiments, the window 500 is disposed directly on the second substrate 150 serving as a display surface of the display panel 100 to protect the display panel.

In some embodiments, the adhesive layer 400 is disposed between the display panel 100 and the window 500. In some embodiments, the adhesive layer 400 is configured to bond the display panel 100 and the window 500 to each other. In some embodiments, the display panel 100 and the window 500 may be attached and fixed to each other by the adhesive layer 400.

Further, in a case where impacts or shocks are externally imposed on the display panel 100 of the display device, the adhesive layer 400 may distribute the impacts to thereby prevent external impacts from being directly and concentratedly inflicted to the display panel 100 or the window 500. In some embodiments, the adhesive layer 400 should have high hardness properties along with its original characteristics of excellent adhesion force.

The adhesive layer 400 according to an exemplary embodiment may have a shore A type hardness of more than 10. The shore hardness refers to the hardness of a material measured by a shore hardness testing apparatus, in which the hardness is determined by a rebound height when dropping a weight attached with a diamond needle from a predetermined height to an experimental surface of the testing material. The shore hardness is used to represent the hardness of metal materials, rubber, resins, or the like.

Further, the adhesive layer 400 according to an exemplary embodiment may have a viscosity in a range of about 2,000 millipascal-second (mPa·s) to about 150,000 mPa·s.

The adhesive layer 400 may include an adhesive composition according to an exemplary embodiment.

In some embodiments, the adhesive composition may include an oligomer in an amount of about 30 wt % to about 70 wt %; at least four kinds of monomers in an amount of about 25 wt % to about 65 wt %, each having different glass transition temperatures; and a photopolymerization initiator in an amount of about 1 wt % to about 5 wt %.

In some embodiments, the oligomer has a molecular weight in a range of about 5,000 grams per mole (g/mol) to about 20,000 g/mol. Examples of the oligomer may include polyisoprene having a hydroxyl group, an isocyanate polymer, and urethane.

In some embodiments, the monomer includes at least four kinds of monomers mixed together, each having different glass transition temperatures. For example, the monomer may include a first monomer forming a polymer having a glass transition temperature (Tg), in a polymerization process, in a range of about 95° C. to about 120° C.; a second monomer forming a polymer having a glass transition temperature (Tg) in a range of about 60° C. to about 90° C.; a third monomer forming a polymer having a glass transition temperature (Tg) in a range of about −35° C. to about −25° C.; and a fourth monomer forming a polymer having a glass transition temperature (Tg) in a range of about −60° C. to about −45° C.

In some embodiments, the monomers respectively having different glass transition temperatures may also have different hardnesses, respectively when the first through fourth monomers are cured to form a polymer. In some embodiments, as the glass transition temperature decreases, the hardness decreases as well.

In some embodiments, the first monomer may be dicyclopentanylacrylate having a glass transition temperature (Tg) of about 120° C., methylmethacrylate having a glass transition temperature (Tg) of about 105° C., or isobornyl acrylate having a glass transition temperature (Tg) of about 97° C., and may have a shore A hardness in a range of about 25 to about 30.

In some embodiments, the second monomer may be 2-ethylhexylacrylate having a glass transition temperature (Tg) of about 85° C., or ethylmethacrylate having a glass transition temperature (Tg) of about 65° C., and may have a shore A hardness in a range of about 19 to about 23.

In some embodiments, the third monomer may be 4-hydroxybutylacrylate having a glass transition temperature (Tg) of about −32° C., or laurylacrylate having a glass transition temperature (Tg) of about −30° C., and may have a shore A hardness in a range of about 14 to about 17.

In some embodiments, the fourth monomer may be isooctylacrylate having a glass transition temperature (Tg) of about −60° C., propylacrylate having a glass transition temperature (Tg) of about −45° C., and n-butylacrylate having a glass transition temperature (Tg) of about −55° C., and may have a shore A hardness in a range of about 8 to about 10.

Although the kinds of the first through fourth monomers are illustrated as an example, the kinds of monomers according to an exemplary embodiment of the present invention are not limited thereto.

The adhesive layer according to an exemplary embodiment may include an adhesive composition containing a polymer that includes: the first monomer in an amount of about 35 wt % to about 65 wt %; the second monomer in an amount of about 15 wt % to about 25 wt %; the third monomer in an amount of about 15 wt % to about 25 wt %; and the fourth monomer in an amount of about 5 wt % to about 15 wt %.

In some embodiments, the adhesive layer 400 may include a photopolymerization initiator, an antioxidant, a plasticizer, and/or the like as an additive. Herein, the photopolymerization initiator may utilize a mixture of a short wavelength initiator (e.g., 1-hydroxycyclohexyl benzophenone) and a long wavelength initiator (e.g., diphenyl(2,4,6-trimethylbenzoyl)phosphine oxide)

As set forth above, the adhesive layer 400 including the adhesive composition according to an exemplary embodiment is configured to adhesively bond the display panel 100 and the window 500 while being interposed therebetween, and also to prevent external impacts from being directly inflicted on the display device by having a shore A hardness of more than or equal to about 10.

Accordingly, an exemplary embodiment of the present disclosure may provide a display device capable of preventing, for example, tilting defects of the window 500 of the display device caused by external impacts or misalignment defects of the first substrate 110 and the second substrate 150.

Figure 4:
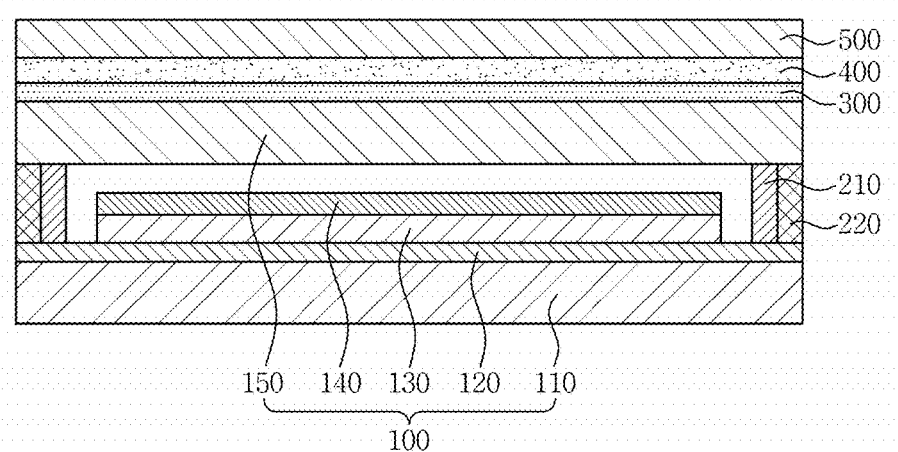
FIG. 4 is a cross-sectional view illustrating a display device according to another exemplary embodiment.

FIG. 4 is a cross-sectional view illustrating a display device according to another exemplary embodiment.

The display device according to the present exemplary embodiment may include substantially the same configurations as those of the display device illustrated in FIG. 1, except for further including a polarizing layer 300. Accordingly, identical configurations may be referred to by identical reference numerals, and the repeated descriptions pertaining thereto will be omitted.

Referring to FIG. 4, the display device according to the present exemplary embodiment includes a display panel 100, the polarizing layer 300, an adhesive layer 400, and a window 500.

In some embodiments, the polarizing layer 300 may be disposed on a light emitting surface of the display panel 100, that is, an upper surface thereof. In some embodiments, the polarizing layer 300 may allow light directed from the display panel 100 to be polarized, thereby achieving improved image quality of images displayed on the display panel 100.

In some embodiments, the window 500 is disposed on the polarizing layer 300. Further, the adhesive layer 400 is disposed between the window 500 and the polarizing layer 300.

In some embodiments, the adhesive layer 400 is configured to bond the display panel 100 on which the polarizing layer 300 is disposed and the window 500 to each other. Further, when impacts or shocks are externally imposed on the display panel 100 of the display device, the adhesive layer 400 may distribute the impacts, thereby preventing the external impacts from not being directly or concentratedly inflicted on the display panel 100 or the window 500.

In some embodiments, although not illustrated, the display device may further include a black film. The black film may be attached on a rear surface of the first substrate 100 and may prevent a show-through phenomenon of the rear surface of the display panel 100 while the display device is being operated. In some embodiment, the rear surface of the first substrate 110 may be printed to have a black color, in lieu of the black film.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be combined to produce further embodiments consistent with the present teachings.

What is claimed is:

1. A display device comprising:
a display panel;
a window on a surface of the display panel; and
an adhesive layer between the display panel and the window,
wherein the display panel comprises i) a first substrate, ii) a barrier layer stacked on the first substrate, iii) a driver circuit unit stacked on the first barrier layer, and iv) a second substrate between the adhesive layer and the driver circuit unit, and
wherein the adhesive layer comprises an adhesive composition, the adhesive composition containing:
a first polymer having a glass transition temperature (Tg) in a range of about 95° C. to about 120° C.;
a second polymer having a glass transition temperature (Tg) in a range of about 60° C. to about 90° C.;
a third polymer having a glass transition temperature (Tg) in a range of about −35° C. to about −25° C.; and
a fourth polymer having a glass transition temperature (Tg) in a range of about −60° C. to about −45° C.

2. The display device of claim 1, wherein the adhesive layer has a shore A hardness of more than or equal to about 10.

3. The display device of claim 1, wherein the first polymer is at least one of poly-dicyclopentanylacrylate, poly-methylmethacrylate, and poly-isobornylacrylate.

4. The display device of claim 1, wherein the second polymer is at least one of poly-2-ethylhexylacrylate and poly-ethylmethacrylate.

5. The display device of claim 1, wherein the third polymer is at least one of poly-4-hydroxybutylacrylate and poly-laurylacrylate.

6. The display device of claim 1, wherein the fourth polymer is at least one of poly-isooctylacrylate, poly-propylacrylate, and poly-n-butylacrylate.

7. The display device of claim 1, wherein the display panel comprises:
a polarizing layer stacked on the second substrate, the polarizing layer facing the window.

8. The display device of claim 7, wherein the adhesive layer is disposed between the polarizing layer and the window.

9. The display device of claim 7, further comprising a black film attached on a rear surface of the display panel.

10. The display device of claim 7, wherein the display panel is an organic light emitting display panel.

11. The display device of claim 7, wherein the display panel is a liquid crystal display panel.

\* \* \* \* \*